United States Patent
Ku

(10) Patent No.: US 7,196,904 B2
(45) Date of Patent: Mar. 27, 2007

(54) IC PACKAGE WITH AN IMPLANTED HEAT-DISSIPATION FIN

(75) Inventor: Shih-Chang Ku, Taipei (TW)

(73) Assignee: Via Technologies, Inc., Taipei (TW)

( * ) Notice: Subject to any disclaimer, the term of this patent is extended or adjusted under 35 U.S.C. 154(b) by 255 days.

(21) Appl. No.: 10/642,219

(22) Filed: Aug. 18, 2003

(65) Prior Publication Data
US 2004/0037043 A1 Feb. 26, 2004

(30) Foreign Application Priority Data
Aug. 20, 2002 (TW) .............................. 91118842 A

(51) Int. Cl.
*H05K 7/20* (2006.01)
*F28D 7/00* (2006.01)
*H01L 23/28* (2006.01)

(52) U.S. Cl. ............... 361/703; 165/80.2; 165/185; 257/722; 257/796

(58) Field of Classification Search ............ 165/80.2, 165/185; 174/16.3; 257/706–707, 712–713, 257/796, 722; 361/703–710, 714, 722, 717–718; 438/122, 126, 127
See application file for complete search history.

(56) References Cited

U.S. PATENT DOCUMENTS

| 5,311,060 A * | 5/1994 | Rostoker et al. ............. 257/796 |
| 5,344,795 A * | 9/1994 | Hashemi et al. ......... 264/272.15 |
| 5,705,851 A * | 1/1998 | Mostafazadeh et al. ..... 257/675 |
| 2001/0001070 A1* | 5/2001 | Hsu et al. ................... 438/126 |

* cited by examiner

*Primary Examiner*—Gregory Thompson
(74) *Attorney, Agent, or Firm*—Troxell Law Office PLLC

(57) ABSTRACT

An IC package with an implanted heat-dissipation fin is introduced. The IC package provides a plastic package to seal an IC chip. One end of the heat-dissipation fin is implanted inside the plastic package, and another end is left outsides for directly heat-exchanging with a surrounding heat-transfer media. By providing the implanted heat-dissipation fin, a more efficient and broader heat-dissipation path for the IC package can be established so that the total heat dissipation of the IC package can be enhanced.

3 Claims, 4 Drawing Sheets

IC PACKAGE WITH AN IMPLANTED HEAT-DISSIPATION FIN

BACKGROUND OF THE INVENTION (1) Field of the Invention

The invention relates to an IC package with an implanted heat-dissipation fin, and more particularly to the IC package whose encapsulant merges a protrusive heat-dissipation fin for rapidly dissipating heat generating by the chip to the ambient.

(2) Description of the Prior Art

The concern of heat dissipation in IC packages or electronic devices is rising to an interesting degree that it just can't be ignored anyway in design; especially for those devices with hi-power chips. Generally in the art, two options are usually applied to resolve the heat-dissipating problem of IC packages; that is, attaching a heat-dissipation fin, or say a heat sink, directly onto the local IC package, or mounting an impinging fan aside the concerned IC package. However, foregoing two resolutions can only form an expediting mechanism that can only remove surface heat of the IC package, not the source heat deep in the poor-heat-conductivity encapsultant of the local IC package. Definitely, though the property of poor heat-conductivity is a nature of the plastic-made (typically, epoxy resin-made) encapsultant, yet the effort to quickly remove the interior heat thereof is still appreciated for the sake of reducing possible breakdown of the chip inside the hot encapsultant.

In the art, various efforts have been utilized to meet the aforesaid heat-dissipation problem to the encapsultant of IC package, and some of them are shown in FIG. 1 through FIG. 5.

Referring to FIG. 1, a drop-in heat spreader is schematically shown in an IC package. A heat-generating chip 11 resting on a pad 12 is shown to be sealed by an encapsultant 10 of the IC package 1. The drop-in heat spreader 13 buried in the encapsultant 10 is located by a predetermined spacing under the pad 12 as well as the chip 11. The drop-in heat spreader 13 is introduced to spread the heat of the chip 11 inside the encapsultant 10. Upon such an arrangement, though the heat generated by the chip 11 can be easily spread out by the drop-in heat spreader 13, yet the heat is obviously still kept inside the encapsultant 10. Furthermore, the location of the heat spreader 13 is adjacent to the PCB side 100 of IC package 1 which in application can only leave a pretty small spacing with the printed circuit board (not shown), and thus the effect of the heat spreader 13 to lead major heat downward to dissipate through the PCB side 100 is definitely not superior.

Referring now to FIG. 2, an IC package 1 with an exposed pad 12 is schematically shown in which a bottom surface of the pad 12 is exposed to, typically flush with, the PCB side 100 of the encapsultant 10. However, as described above, efficiency provided by the heat-dissipation mechanism of the exposed pad 12 to dissipate major heat through the PCB side 100 is not satisfied. Also in the art, the IC package 1 with the exposed pad 12 is usually designed to mount right above a specific metal-skin portion of the PCB (not shown) so that a better thermal way can be established between the PCB and the IC package 1. However, the specific metal-skin portion does make difficult and higher cost to manufacture of the PCB.

Referring now to FIG. 3, the IC package 1 includes an exposed heat slug 13 directly contacting the pad 12 inside the encapsultant 10. Again, such a design still utilizes the downward heat-dissipation path through the PCB side 100 of the encapsultant 10. Except for the manufacturing problem mentioned above, the design of FIG. 3 still has problems in matching accuracy between the pad 12 and the heat slug 13 so that it is seldom used in practice.

In either example shown above, FIG. 1 through FIG. 3, the IC package 1 is one of plastic quad flat packs (known as PQFP) which the manufacturing is critical in molding and thereby the mold-in heat spreader 13 can only arranged at the PCB side 100 of the IC package 1, not the opposing open side 200 which can proved a better ventilation environment after mounting the IC package. On the other hand, for an IC package of ball grid array packs (known as BGA), similar drop-in heat spreader can be also adopted. However, in consideration of the ball grids, the drop-in heat spreader of a BGA IC package is usually arranged close to the open side 200 of the encapsultant 10; i.e. the side away from the printed circuit board or the main board which mounts the IC package.

Referring now to FIG. 4, a BGA IC package 1 having a stacked-die heat spreader 13 is shown. As illustrated, the heat spreader 13 is stacked right on the chip 11 inside the encapsultant 10 so that the major heat-dissipating pathway is directed upward through the open side 200 of the encapsultant 10. However, in this example, the heat spreader 13 is still buried in the encapsultant 10 so that the overall heat-dissipation efficiency promoted by including the heat spreader 13 is obviously not satisfied.

Referring now to FIG. 5, another type of exposed drop-in heat spreader is shown in a BGA IC package. As illustrated, the exposed drop-in heat spreader 13 bridges over the chip 11 in the encapsultant 10 and has both ends foot on the pad 12. Also, the top surface of the heat spreader 13 is exposed to the open side 200 of the IC package 1. By proving the heat spreader 13 of FIG. 5, it is apparent that the heat conducted by the heat spreader 13 can be easily transferred to the atmosphere through the open side 200 of the IC package 1 (precisely, through the top surface of the heat spreader 13). However, the heat generated by the chip 11 can be transferred to the heat spreader 13 only through the poor-conductivity material of the encapsultant 10 between the heat spreader 13 and the chip 11. Definitely, upon such an arrangement, though the difficulty for the heat to dissipate from the IC package 1 to the surroundings is eased, yet the difficulty for the heat to be conveyed out from the chip 11 through the encapsultant's material or the pad 12 still remains. Empirically, the hope of increasing overall heat dissipation of the IC package 1 by including the heat spreader 13 as shown in FIG. 5 is sadly vague.

In the technique shown in FIG. 1 to FIG. 3, heat dissipation of the IC package 1 is mainly interfaced through the heat spreader 13 or the pad 12 at the PCB side 100. On the other hand, heat dissipation of the IC package 1 in FIG. 4 or FIG. 5 is mainly through the heat spreader 13 at the open side 200. No matter whether the packing of the IC package 1 is a BGA or a PQFP, the mold-cavity consideration in molding the packing restricts itself to an encapsultant 10 with a limited volume which just can't accommodate a satisfied heat spreader 13. Also, it is well known in the art that the involvement of any heat spreader 13, described above, in an IC package 1 can only have an enhanced heat dissipation capability by a maximum 20% increase. Therefore, it is usually seen in application that an external heat sink or an impinging fan is introduced to expedite the heat dissipating from the IC package 1 to the surroundings.

Referring now to FIG. 6, an IC package 1 (say the one of FIG. 1) integrates a heat sink 2, or called as a heat-dissipation fin, at the open side 200 of the encapsultant 10 is shown. The heat sink 2 for providing the IC package 1 a broader heat dissipation surface is set onto the open side 200 with a sandwiched adhesive pad 3. Upon such an arrangement, it is clear to see that two heat-transfer retarders exist in this combination to slow down the overall heat dissipation efficiency. One retarder is still the poor-conductivity encapsultant 10, and the other is the adhesive pad 3 which forms substantial contact thermal resistance between the encapsultant 10 and the heat sink 2.

Therefore, it is always appreciated in the art that an improvement to increase the heat dissipation capability of the IC package 1 can be provided.

SUMMARY OF THE INVENTION

Accordingly, it is a primary object of the present invention to provide an IC package with an implanted heat-dissipation fin which can dissipate the heat generated by the chip directly by heat conduction to the surroundings through the solid-contact heat-dissipation fin and thereby which can enhance greatly the overall heat dissipation capability of the IC package.

It is another object of the present invention to provide a method for implanting a heat-dissipation fin while packing an IC chip, particularly during a curing of a dispensing molding process, which can integrate a heat-dissipation fin as a piece with an encapsultant of the IC package.

The IC package with an implanted heat-dissipation fin according to the present invention comprises an encapsultant having a PCB side and an opposing open side, a chip held inside the encapsultant, and a heat-dissipation fin implanted in the encapsultant with a portion thereof extending outside the open side. By providing the IC package of the present invention, a broader and more rapid heat-dissipating pathway for the heat generated by the chip can be obtained.

In one embodiment of the present invention, the heat-dissipation fin can contact directly with the chip so that a solid heat conduction relationship can be established in between.

In one embodiment of the present invention, the heat-dissipation fin and the chip can be kept apart inside the encapsultant by a predetermined spacing.

In one embodiment of the present invention, the portion of the heat-dissipation fin outside the encapsultant can further provide at least a hookup point for further hanging or mounting purposes.

According to the present invention, the method for implanting a heat-dissipation fin while packing an IC chip comprises a step of having a chip encapsulated inside an encapsultant at a melted state, a step of implanting a heat-dissipation fin into the encapsultant at a predetermined position above the chip and with a portion of the heat-dissipation fin left outside the encapsultant before the encapsultant is cured, and a step of holding in position the encapsultant and the heat-dissipation fin till the encapsultant is cured.

In the method of the present invention, the predetermined position related to the chip and the heat-dissipation fin can be a solid contact state or a position with a predetermined spacing.

All these objects are achieved by the IC package with an implanted heat-dissipation fin described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to an IC package with an implanted heat-dissipation fin. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

In the following description, elements that have same function but slight different shapes will be labeled by the same number and identical name so as to ensure overall consistency.

Figure 7A:
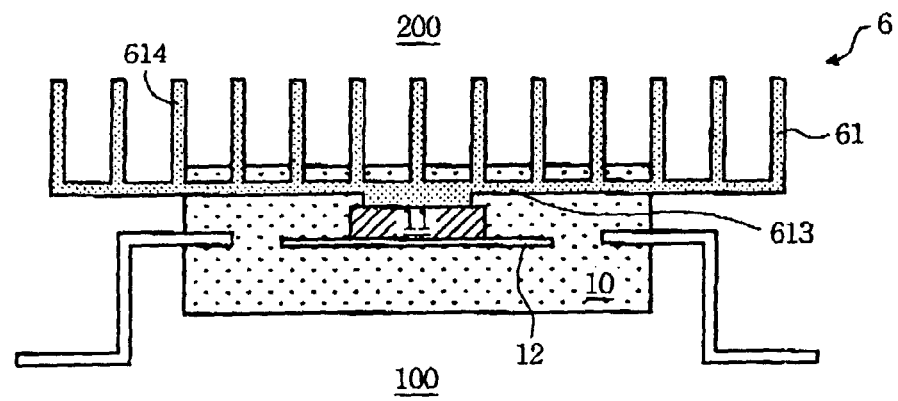
FIG. 7A is a schematic cross-sectional view of a preferred embodiment of the IC package with an implanted heat-dissipation fin in accordance with the present invention.
Figure 7B:
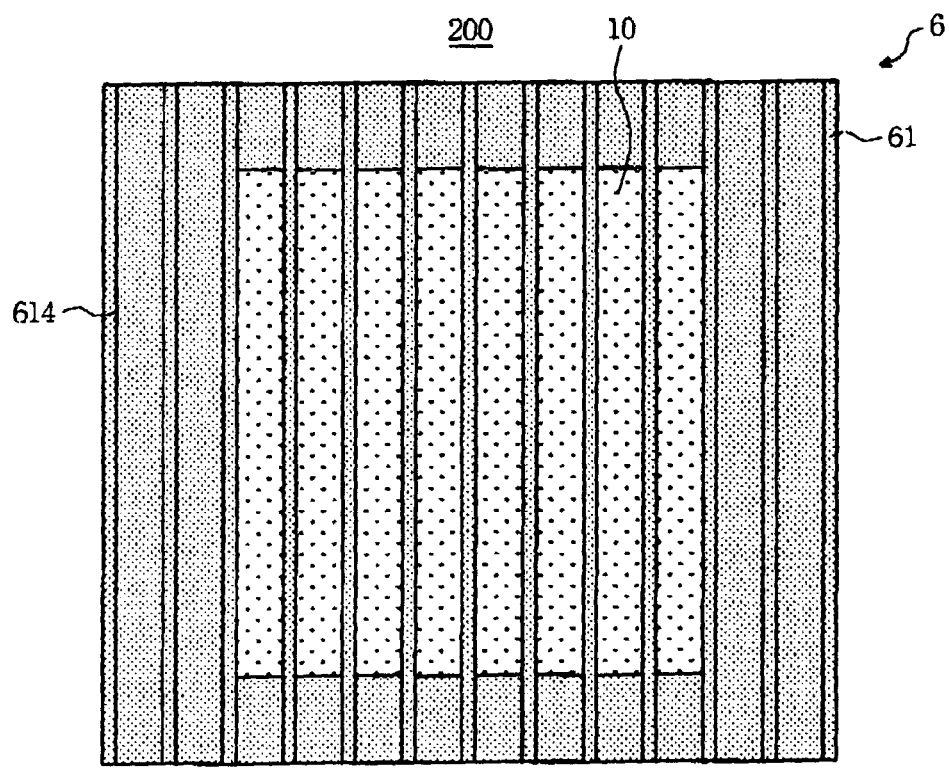
FIG. 7B is a top view of FIG. 7A.

Referring now to FIG. 7A and FIG. 7B, a schematic cross-sectional view and a top view of a preferred embodiment of the IC package with an implanted heat-dissipation fin are shown, respectively. In this embodiment, the IC package 6 comprises an encapsultant 10 having a PCB side 100 and an opposing open side 200, a chip 11 upheld by a pad 12 inside the encapsultant 10, and a heat-dissipation fin 61 implanted in the encapsultant 10 with a portion thereof extending outside the open side 200 of the encapsultant 10.

As shown, the heat-dissipation fin 61 of the present invention can be wider than the encapsultant 10. The bottom portion 613 of the heat-dissipation fin 61 is buried into the encapsultant 10 while The opposing upper portion 614 of the heat-dissipation fin 61 is extended into the open space above the open side 200 of the IC package 6. In particular, the upper portion 614 of the heat-dissipation fin 61 includes at least a plurality of fins and occupies an area, view from a top position, broader than the encapsultant 10 does. Thereby, the heat generated by operating the chip 11 can be directly transferred by conduction to the upper portion 614 of the heat-dissipation fin 61 and then dissipates into the open space above the IC package 6. It is noted that a broader and more rapid heat-dissipating pathway for the IC package 6 of the present invention is obtained by reducing the importance of the encapsultant 10 in heat dissipation to a minimum.

As illustrated, the embodiment shown in FIG. 7A and FIG. 7B is an IC package of a PQFP packing. Yet, the technique of the present invention can be still easily applied to an IC package of a BGA packing.

Figure 8:
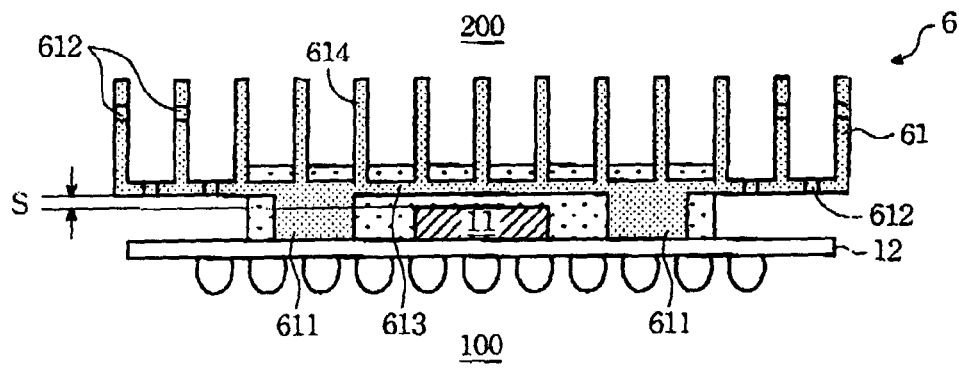
FIG. 8 is schematic cross-sectional view of another preferred embodiment of the IC package with an implanted heat-dissipation fin in accordance with the present invention.

Referring now to FIG. 8, another preferred embodiment of the IC package with an implanted heat-dissipation fin in accordance with the present invention is shown. In this embodiment, two feet 611 that form part of the bottom portion 613 of the heat-dissipation fin 61 foot on the pad 12 while the upper portion 614 protrudes beyond the open side 200 of the IC package 6. In particular, in this embodiment, the heat-dissipation fin 61 bridges over the chip 11 by these two feet 611 of the bottom portion 613. Thereby, the major heat pathway from the chip 11 to the surroundings includes the pad 12 as well as the heat-dissipation fin 61.

In the present invention, the position relationship between the chip 11 and the heat-dissipation fin 61 inside the encapsultant 10 can be a solid contact state as shown in FIG. 7A or a position with a predetermined spacing S as shown in FIG. 8.

As shown in FIG. 8, the upper portion 614 of the heat-dissipation fin 61 can further include at least a hookup point 612. The hookup point 612 can be formed as a hole as shown in FIG. 8, a protrusion, an indent, or any that can provide further hanging or mounting purposes. By providing the hookup point 612 of the present invention, the IC package 6 can then mount extension heat-dissipation accessories such as a connection metal to the casing, a connecting arm extending to another heat-dissipation fin, a impinging fan, a heat-pipe structure, a water-cooling structure, or any the like.

Figure 9:
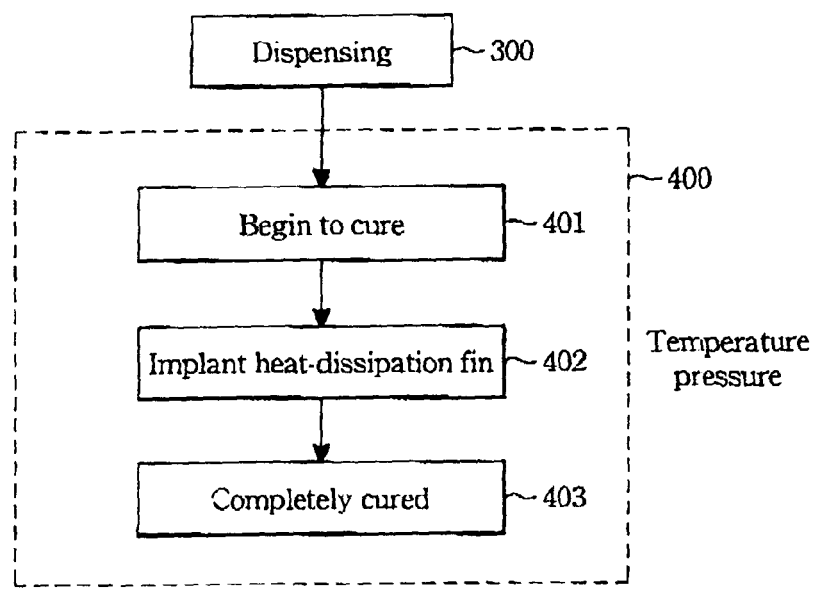
FIG. 9 is a flowchart of a preferred method for implanting a heat-dissipation fin while packing an IC chip in accordance with the present invention.

Referring now to FIG. 9, a flowchart of a method for implanting a heat-dissipation fin while packing an IC chip in accordance with the present invention is shown. The method, targeted to manufacture the IC package described above, includes a dispensing process 300 of the encapsultant material and a following curing process 400. After the dispensing process 300, the encapsultant burying the chip is actually at a melted state. And, only after the curing process 400, the encapsultant can then be cured or, say, solidified. As shown, the curing process 400 includes a step 401 of beginning to cure when the encapsultant is still at a soft melted state, a step 402 of implanting a heat-dissipation fin into the encapsultant at a predetermined position above the chip and with a portion (in particular, the upper portion described above) of the heat-dissipation fin left outside the encapsultant before the encapsultant is cured, and a step 403 of holding in position the encapsultant and the heat-dissipation fin till the encapsultant is cured. Definitely, proper tooling should be used in these processes to avoid any unexpected displacement of the heat-dissipation fin.

In the present invention, the chip is obviously set in advance prior to the dispensing process 300 which proceeds to encapsulate the chip by the melted encapsultant material.

Apparently, in the preceding paragraph, several processes other than the dispensing process 300 and the curing process 400 for completely manufacturing an IC package are omitted herein. The reason for such omitting is because those processes are well known to the skilled person in the art and the improvement of the present invention does focus only on the curing process 400.

Similarly, in the method of the present invention, the predetermined position related to the chip and the heat-dissipation fin inside the encapsultant can be a solid contact state or a position with a predetermined spacing.

According to the present invention, the method for implanting a heat-dissipation fin while packing an IC chip can be applied to manufacturing an IC package of a PQFP packing, a BGA packing, or any other type of packing.

In the method of the present invention, the curing process 400 for solidifying the encapsultant of the IC package can be better performed under a proper control upon the operation temperature and the pressure. However, this control is well known in the art and thus will be omitted herein.

In the step 402 of implanting the heat-dissipation fin into the encapsultant, the heat-dissipation fin can be held in position by landing the bottom portion onto the chip as shown in FIG. 7A, by footing on the pad as shown in FIG. 8, or by using any jig that is suitable to be applied to the operation environment of carrying out the curing process 400.

In the present invention, the heat-dissipation fin can be a one-piece structure, or can be a combination of two separate parts. In an embodiment of the latter, the heat-dissipation fin can be separated to a bottom portion and an upper portion for being screwed with the bottom portion to make an integrated part. The bottom portion can be molded in the encapsultant in manufacturing the IC package but shall leave an exposed place to connect with the upper portion while in application. Yet, the embodiment of two-piece heat-dissipation fin described above still needs to be formed integrally as the former one-piece structure while in application. Thus, the technique of multiple-piece heat-dissipation fin shall be still in the scope of the present invention.

Figure 1:
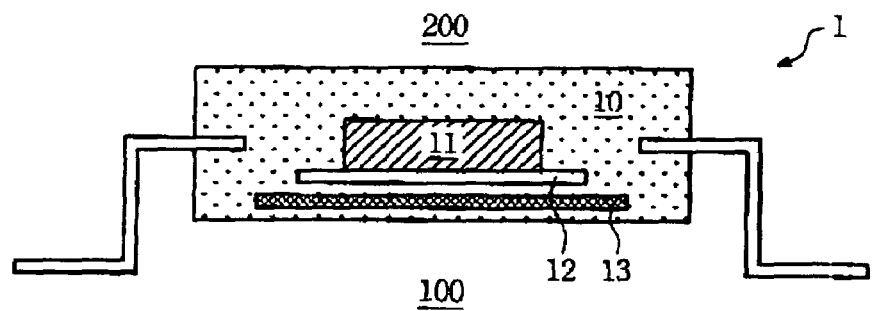
FIG. 1 is a schematic cross-sectional view of a conventional IC package with a drop-in heat spreader.
Figure 2:
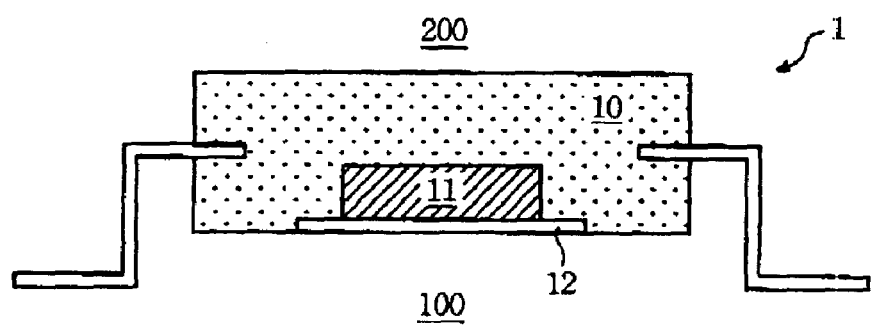
FIG. 2 is a schematic cross-sectional view of a conventional IC package with an exposed drop-in heat spreader.
Figure 3:
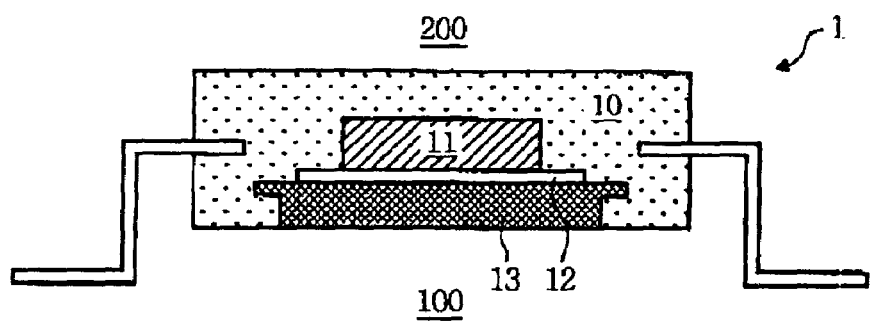
FIG. 3 is a schematic cross-sectional view of a conventional IC package with an exposed heat slug.
Figure 4:
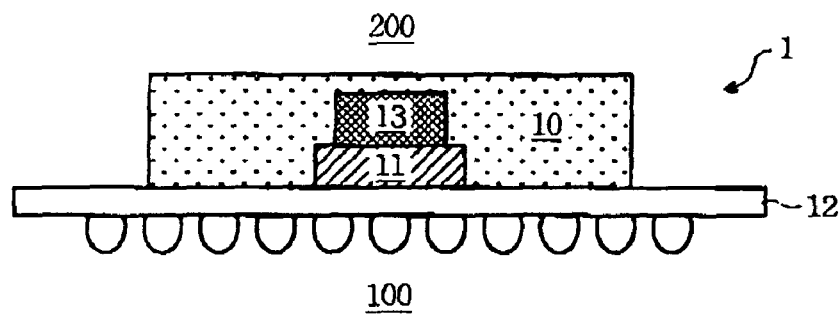
FIG. 4 is a schematic cross-sectional view of a conventional IC package with a stacked-die heat spreader.
Figure 5:
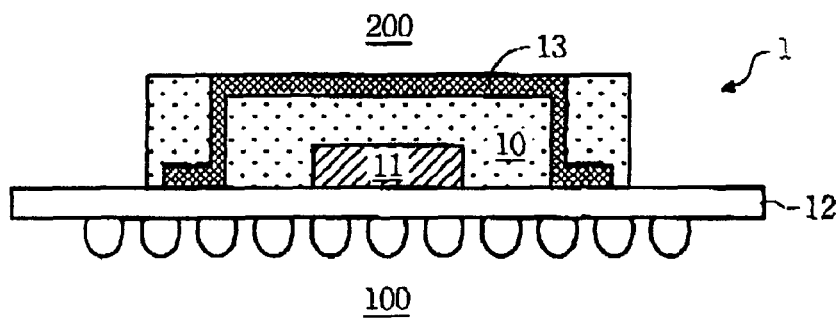
FIG. 5 is a schematic cross-sectional view of a conventional IC package with another exposed drop-in heat spreader.
Figure 6:
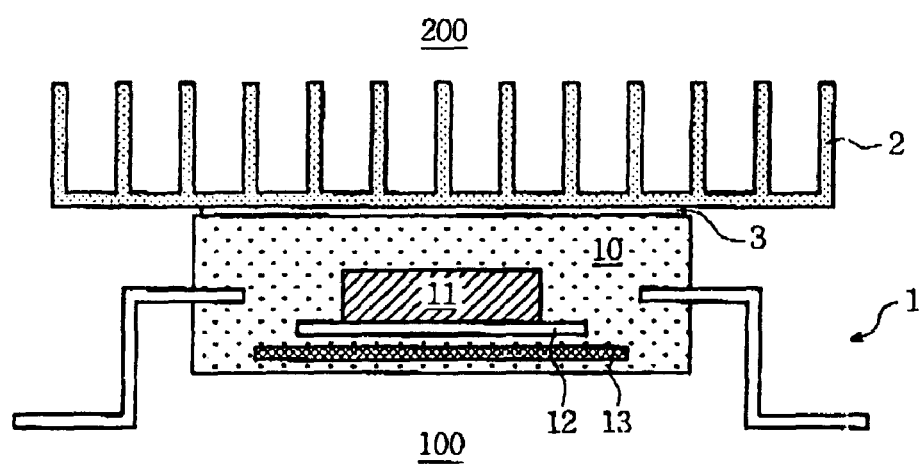
FIG. 6 is a schematic cross-sectional view of the conventional IC package of FIG. 1 further having an external heat sink.

To show the superiority of the present invention, a typical simulation is presented to compare the heat-dissipation capacity between an IC package with a conventional add-in heat sink as shown in FIG. 6 and an IC package with an implanted heat-dissipation fin as shown in FIG. 7A (but, both are BGA packed). Following are assumptions for this simulation.

1. Material for the heat sink: aluminum made, 40×40×8.5 mm;
   Material for the heat-dissipation fin: aluminum made, 40×40×8.5 mm, with 0.5 mm high of bottom protrusion to the chip;
2. Adhesive pad for the heat sink: thermal grease;
3. Chip for both: power 3.5 watt, 8.24×8.06×0.325 mm
4. Packing for both: BGA, 35×35×0.56 mm, with a four-layer base;
5. PCB for both: 100×100×1.6 mm, four layers; and
6. Boundary for both: environmental temperature 45° C., natural convention flow.

The simulation results are as follow.

1. IC package with the conventional add-in heat sink: chip temperature 93.9° C., thermal resistance 13.97° C./W; and
2. IC package with the implanted heat-dissipation fin: chip temperature 81.9° C. (12° C. low), thermal resistance 10.54° C./W (reduced by 24.55%).

From this simulation, the superiority of the present invention over the convention design is clear.

By providing the implanted heat-dissipation fin to the IC package in accordance with the present invention, following advantages can be obtained.

1. The heat generated by operating the chip can be rapidly and easily dissipated to the surroundings by the implanted heat-dissipation fin which can be sized certainly in advance to meet the application situation.

2. No adhesive pad is required so that the thermal resistance can be kept at an acceptable level.

3. Hookup points can provide further extension usage to additional heat-dissipation facilities.

4. The upper portion can be purposely designed to locate away from possible heat spots so that no specific consideration upon the PCB or the main board is required.

5. The heat-dissipation fin is easily implanted into the encapsultant by utilizing the soft melted state of the encapsultant in curing.

6. From the simulation results, it is quite certain that the present invention can provide the chip with a lower operation temperature.

While the present invention has been particularly shown and described with reference to a preferred embodiment, it will be understood by those skilled in the art that various changes in form and detail may be without departing from the spirit and scope of the present invention.

I claim:

1. A method for implanting a heat-dissipation fin while packing an IC chip, comprising:

positioning a chip inside an encapsultant in a melted state;

before the encapsultant is cured, implanting a heat-dissipation fin in the encapsultant at a predetermined position, in the predetermined position a lower portion of the heat-dissipation fin having a predetermined amount of the encapsultant located on a top thereof and an upper portion of the heat-dissipation fin extending outwardly above the opposing open side of the encapsultant; and holding the encapsultant and the heat-dissipation fin in the predetermined position until the encapsultant is cured.

2. The method for implanting a heat-dissipation fin while packing an IC chip according to claim 1, wherein said predetermined position is a solid contact state.

3. The method for implanting a heat-dissipation fin while packing an IC chip according to claim 1, wherein said predetermined position is a position with a predetermined spacing.

* * * * *